(12) United States Patent
Shirakawa et al.

(10) Patent No.: US 12,136,912 B2
(45) Date of Patent: Nov. 5, 2024

(54) RF FILTER DEVICE

(71) Applicant: RF360 Singapore Pte. Ltd., Singapore (SG)

(72) Inventors: Alexandre Agusto Shirakawa, San Diego, CA (US); Marcel Giesen, Munich (DE)

(73) Assignee: RF360 Singapore Pte. Ltd., Singapore (SG)

( * ) Notice: Subject to any disclaimer, the term of this patent is extended or adjusted under 35 U.S.C. 154(b) by 729 days.

(21) Appl. No.: 17/256,987

(22) PCT Filed: Jul. 1, 2019

(86) PCT No.: PCT/EP2019/067596
§ 371 (c)(1),
(2) Date: Dec. 29, 2020

(87) PCT Pub. No.: WO2020/015993
PCT Pub. Date: Jan. 23, 2020

(65) Prior Publication Data
US 2021/0143793 A1  May 13, 2021

(30) Foreign Application Priority Data
Jul. 19, 2018 (DE) .......................... 102018117520.5

(51) Int. Cl.
*H03H 9/56* (2006.01)
*H03H 9/02* (2006.01)
*H03H 9/17* (2006.01)
*H03H 9/54* (2006.01)

(52) U.S. Cl.
CPC ........ *H03H 9/564* (2013.01); *H03H 9/02086* (2013.01); *H03H 9/175* (2013.01); *H03H 9/542* (2013.01); *H03H 9/568* (2013.01)

(58) Field of Classification Search
CPC .... H03H 9/564; H03H 9/02086; H03H 9/175; H03H 9/542; H03H 9/568
See application file for complete search history.

(56) References Cited

U.S. PATENT DOCUMENTS 5,714,917 A * 2/1998 Ella .......................... H03H 3/04
332/149
6,603,241 B1 * 8/2003 Barber ................... H03H 9/175
310/335

(Continued)

FOREIGN PATENT DOCUMENTS

CN  1723618 A  1/2006
DE  10315239 A1 * 10/2004  ............... H03H 3/02

(Continued)

OTHER PUBLICATIONS

International Search Report and Written Opinion—PCT/EP2019/067596—ISA/EPO—Oct. 4, 2019.

*Primary Examiner* — Andrea Lindgren Baltzell
*Assistant Examiner* — Kimberly E Glenn
(74) *Attorney, Agent, or Firm* — Polsinelli

(57) ABSTRACT

An RF filter device that provides small spatial dimensions and good electric performance is provided. The filter device comprises a resonator structure and a further electric circuit. An acoustic minor is arranged between the active structure and the further electric circuit.

15 Claims, 2 Drawing Sheets

(56) References Cited

U.S. PATENT DOCUMENTS

| | | | |
|---|---|---|---|
| 7,378,781 B2* | 5/2008 | Vilander | H03H 9/02102 |
| | | | 310/341 |
| 10,069,474 B2* | 9/2018 | Yun | H05K 1/0306 |
| 2002/0089393 A1 | 7/2002 | Tikka et al. | |
| 2015/0318461 A1 | 11/2015 | Jacobsen et al. | |

FOREIGN PATENT DOCUMENTS

| | | |
|---|---|---|
| EP | 2091147 A1 | 8/2009 |
| WO | 2010066451 A1 | 6/2010 |
| WO | 2018111532 A1 | 6/2018 |

* cited by examiner

RF FILTER DEVICE

The present invention refers to RF filter devices with a compact construction and good electric properties.

Mobile communication devices need RF filter devices to separate wanted signals from unwanted signals. Typically, RF filter devices comprise resonators such as electroacoustic resonators. Electroacoustic resonators employ the piezoelectric effect to convert between RF signals and acoustic waves.

However, the current trend towards miniaturization and the current trend towards a larger number of electric functions demand for smaller components having an increased number of circuit elements. Correspondingly, it is difficult to maintain a specific isolation between different segments of the circuits of the corresponding RF filter device.

Conventional RF filter devices use BAW resonators (BAW=bulk acoustic wave) as electroacoustic resonators in filter topologies.

However, with conventional resonators it is difficult to comply with modern specifications while simultaneously arranging more circuit elements in a smaller volume.

Thus, what is wanted is an RF filter device that can be manufactured with smaller spatial dimensions and that provides a better electrical performance.

To that end, an RF filter device according to independent claim 1 is provided. Dependent claims provide preferred embodiments.

The RF filter device comprises a resonator structure and a further electric circuit. The resonator structure comprises an active structure and an acoustic mirror. The active structure comprises a bottom electrode, a top electrode and a piezoelectric material between the bottom electrode and the top electrode. The acoustic mirror is arranged between the active structure and the further electric circuit.

The RF filter device may be an RF filter component that comprises filter structures that may be used in modern communication devices.

The resonator structure of the RF filter device comprises the elements necessary to establish an electroacoustic resonator, e.g. for use in an RF filter. One part of the resonator structure is the active structure. Another part of the resonator structure is the acoustic mirror. The active structure has the piezoelectric material between the bottom electrode and the top electrode and this sandwich construction can be used to convert between RF signals applied to the electrodes and acoustic waves, e.g. longitudinal acoustic waves propagating between the electrodes.

To confine the acoustic energy to the resonator structure, the acoustic mirror acts as a reflection structure for the acoustic waves and reflects acoustic waves back to the active structure.

A high reflection coefficient of the acoustic mirror is wanted if a high quality factor Q of the resonator should be obtained.

An acoustic mirror usually comprises a layer stack of layers of different acoustic impedance. Each interface between a layer of a low acoustic impedance and a high acoustic impedance—and vice versa—reflects acoustic waves to a certain degree. A plurality of alternating layers of low and high acoustic impedances and correspondingly a plurality of such interfaces can provide—as a whole—a high reflection coefficient to enable high Q resonators.

The bottom electrode can be realized in a bottom electrode layer. The top electrode can be realized in a top electrode layer and the piezoelectric material can be provided in a piezoelectric material layer.

BAW resonators can be of the FBAR-type resonator and of the SMR-type resonator. In an FBAR-type resonator (FBAR=film bulk acoustic resonator) a cavity is arranged below the bottom electrode to confine acoustic energy. In a SMR-type resonator an acoustic mirror is arranged between the bottom electrode of the resonator. Thus, the present RF filter device has a resonator of the SMR-type.

The piezoelectric material can be provided as a monocrystalline piezoelectric material or as a polycrystalline piezoelectric material. The electrodes comprise a conducting material, e.g. a metal.

The distance between the electrodes, i.e. the thickness of the piezoelectric layer, mainly determines the working frequency of the resonator. In particular, the distance mainly determines $\lambda/2$, i.e. half the wavelength of the employed acoustic longitudinal waves.

The further electric circuit of the RF filter device can comprise a single circuit element or a plurality of circuit elements that provide a further functionality of the RF filter device to comply with the trend towards a larger number of electrical functionalities provided by a single device.

The acoustic mirror can be arranged below the bottom electrode of the active structure of above the top electrode of the active structure. Correspondingly, the further electric circuit and its constituent circuit elements are arranged below the acoustic mirror or above the acoustic mirror, respectively.

By arranging the acoustic mirror between the active structure and the further electric circuit an electromagnetic decoupling between the active structure and the further electric circuit is obtained and the isolation between the active structure and the further electric circuit is improved.

Thus, due to the improved isolation, the integration density of circuit elements in the RF filter device is increased and smaller spatial dimensions and/or an improved electrical response of the device can be obtained.

Correspondingly, it is possible that the acoustic mirror establishes an electromagnetic shield. In particular, it is possible that the electromagnetic shield realized by the acoustic mirror electrically decouples the active structure of the resonator structure from the further electric circuit.

To further improve a decoupling it is possible that the lateral dimensions of the acoustic mirror exceed the lateral dimensions of the active structure arranged at one side of the acoustic mirror and the further electric circuit arranged on the respective other side of the mirror. Thus, in a lateral direction the acoustic mirror extends beyond the active structure and/or the further electric circuit.

To provide an electromagnetic shield it is preferred that at least one layer of the acoustic mirror has a high electrical conductivity. To that end, it is preferred that the acoustic mirror comprises at least one layer having a material with a low specific resistivity.

Conventional mirrors comprise layer structures the materials of which are chosen according to their acoustic properties only. To provide a good electromagnetic shield it is now proposed to choose the mirror's materials according to their acoustic properties and according to their electrical properties. It was found that good shielding effects can essentially be obtained without sacrificing sufficiently good acoustic properties.

Thus, the resonator and other circuit components realized in the further electric circuit can be decoupled to a high degree without sacrificing the resonator's acoustic properties.

It is possible that the acoustic mirror is electrically conductive and connected to a ground potential.

Conventional BAW resonators have the material of the mirror chosen according to their acoustic properties. Typical materials for a layer of a high acoustic impedance are W (tungsten) or similar heavy metals. Typical materials for the layers of the low acoustic impedance are a silicon oxide, e.g. silicon dioxide and similar materials.

Neither tungsten nor silicon dioxide are excellent electric conductors but provide good acoustic (impedance) properties.

Thus, an acoustic mirror with at least one layer of high conductivity or an acoustic mirror that is conducting as a whole improves shielding substantially when compared to conventional mirrors.

In particular an acoustic mirror that is electrically conductive because each layer of the mirror is electrically conductive substantially improves a decoupling of the circuit components arranged at the opposing sides of the mirror.

It is possible that the acoustic mirror comprises one or more layers of a first acoustic impedance and one or more layers of a second acoustic impedance. The second acoustic impedance is larger than the first acoustic impedance. The layers of the first acoustic impedance and the layers of the second acoustic impedance comprise metal.

It is also possible that the mirror's layers consist of metal.

In such a layer system an electric charge that moves within the layer system has a rather short path in a material having a relatively high resistivity. In particular, the path length of a charge particle is substantially reduced to the thickness of the layer having the material with a lower conductivity because a corresponding current direction does not lead in a horizontal direction within a layer of a low conductivity. The layers of the higher conductivity establish shunt paths and provide the preferred layers of charge transport.

It is possible that the material of the layers of an acoustic impedance selected from the first and the second acoustic impedance have a conductivity of Al (aluminium) or higher.

Aluminium or a material having a higher conductivity can be used as the material for one of the two acoustic impedances. In particular, aluminum can be used to establish the material of the lower acoustic impedance or aluminum could be used as the main constituent of the layers of the low acoustic impedance.

Correspondingly, an acoustic mirror comprising layers of tungsten and aluminum is—as a whole—conductive and due to the conductivity of aluminum or its corresponding substituent, the acoustic mirror provides a good shielding.

It is possible that the material of the layers of an acoustic impedance selected from the first and the second acoustic impedance comprises or consists of Al (aluminium), Al-Alloys like AlCu (aluminium-copper) Cu (copper) or Cu-alloys like CuNb (copper-niobium), SiO2 or SiOC. Further, the material of the layers of the respective other acoustic impedance comprises or consists of W (tungsten), Au (gold), Pt (platinum), AlN (aluminium nitride), $Ta_2O_5$.

It is possible that the further electric circuit comprises a passive circuit element, an impedance element, a capacitance element, a resistance element, an LC circuit, an LCR circuit, an active circuit element, a switch, an RF switch, a logic circuit, a further resonator, a further electroacoustic resonator and/or an RF filter.

Thus, a resonator of the SMR-type and further circuit elements, e.g. integrated passive devices, e.g. L, C or R elements or switches can be integrated, e.g. monolithically integrated, within the device. Such an integration may be used to establish software reconfigurable filters.

In particular, it is possible that a stacked arrangement of more than one electroacoustic resonator and more than one further electric circuit is possible where mirrors establish a good isolation between the circuit components despite their spatial proximity. Correspondingly, a plurality of filter functionalities and the corresponding circuitry for a control logic and switches can be integrated in a small volume. Thus, software reconfigurable filters are possible where switches are used to select signal paths employing selectively one or a few of a plurality of RF filters to provide a duplex mode of the corresponding device.

Correspondingly, it is possible that the device further comprises an additional acoustic mirror. The active structure is arranged between the acoustic mirror and the additional acoustic mirror. Thus, additional space shielded from the active structure is provided to house additional circuitry.

Correspondingly, it is possible that the device further comprises an additional electric circuit. The additional acoustic mirror is arranged between the active structure and the additional circuit element.

This stacking principle can be extended to a number of n active structures of resonators and n+1 acoustic mirrors such that each active structure is arranged between two adjacent acoustic mirrors. Below a mirror arranged below an active structure and above a mirror arranged above an active structure space is provided for arranging circuitry decoupled from the corresponding active structure. n can be an integer number of 1, 2, 3, 4, 5 or larger.

It is possible that the resonator structure and the further electric circuit are integrated monolithically.

Monolithic integration in the context of the present device refers to circuit elements realized with substantially the same processing steps. Corresponding processing steps are well-known, e.g. from the semiconductor industry. Processing steps for creating bottom electrodes, top electrodes, piezoelectric layers or mirror layers can also be used to deposit material of circuit elements of further electric circuits. Capacitance elements can be realized by depositing material of a bottom electrode, depositing a dielectric material on the bottom electrode and depositing a top electrode on the dielectric material. Inductive elements can be realized by providing a dielectric layer, depositing a conductive material on the dielectric layer and structuring conductor segments, e.g. in the shape of a coil or similar, in the conducting layer.

Also, semiconducting material, conducting material and dielectric material can be used to establish—in a layer construction of two or more layers—switches and control logic circuitry.

Correspondingly, a monolithically integrated device comprising a plurality of functions can be provided with a smaller volume compared to heterogeneously integrated components having resonating structures attached to one chip and semiconductor-based circuitry on another chip and having both chips arranged on a common carrier substrate.

It is possible that the resonator structure and the further electric circuit establish a bandpass filter or a band rejection filter.

Of course, a plurality of filter functionalities can be realized, e.g. to establish a duplexer or a multiplexer of a higher degree.

It is possible that the resonator structure and the further electric circuit are arranged on a carrier.

The carrier may be a carrier comprising silicon, e.g. a silicon chip. Filter structures and electric circuitry structures can be monolithically integrated within or at the interface of the carrier.

It is possible that the RF filter device is a software-configurable RF filter.

In a software-configurable RF filter logic circuitry is embedded together with filter circuitry to establish a monolithic block. The logic circuitry controls, e.g. via switches, the signal path of a signal that may be routed via selected RF filters.

Central aspects of the present RF filter device and details of preferred embodiments are shown in the accompanying schematic figures.

Figure 1:
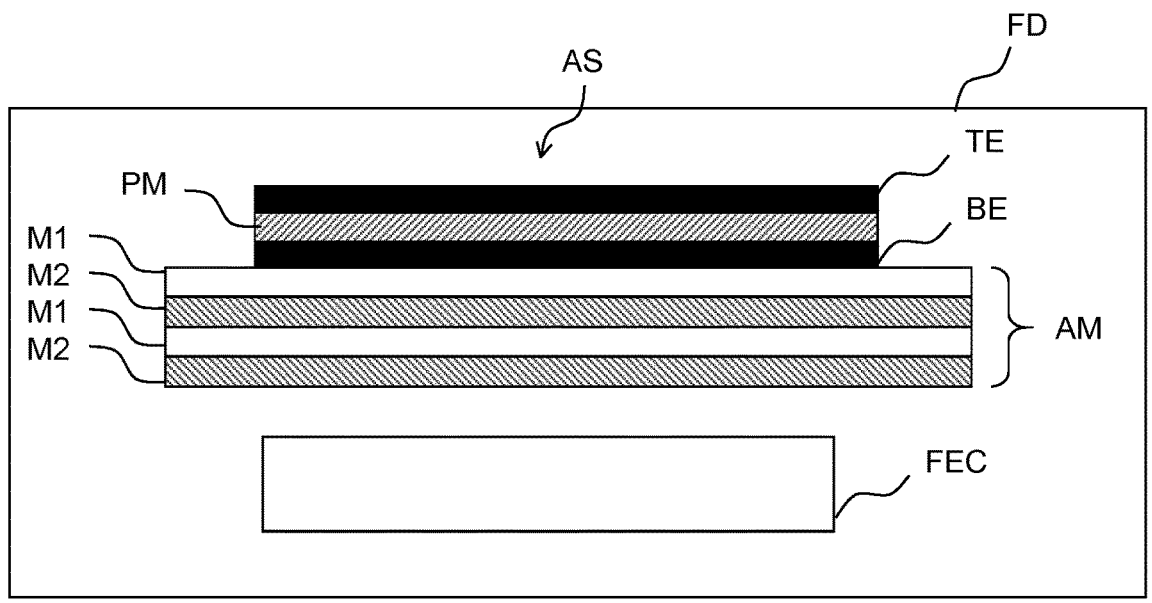
FIG. 1 shows an RF filter device with an acoustic mirror arranged between an active structure and a further electric circuit.

FIG. 1 shows an RF filter device FD comprising an acoustic mirror AM, an active structure AS and a further electric circuit FEC. The active structure AS, together with the acoustic mirror AM, establishes a resonator structure, i.e. an electroacoustic resonator of the SMR-type. The further electric circuit FEC comprises or consists of circuit elements that should be electromagnetically decoupled from the active structure AS. The acoustic mirror AM is arranged between the active structure AS and the further electric circuit FEC.

The active structure has a bottom electrode BE, a top electrode TE and a piezoelectric material PM arranged between the bottom electrode BE and the top electrode TE. The acoustic mirror comprises mirror layers of a first material M1 and of a second material M2. Layers of different materials M1, M2 are arranged alternating in a vertical direction to establish an acoustic Bragg mirror. The first material M1 and the second material M2 have different acoustic impedances. The acoustic impedance of a material is determined by the material's specific density and the material's stiffness parameters such as Young's modulus. Interfaces between materials of different acoustic impedance reflect acoustic wave. Thus, acoustic energy is confined to the active area of the resonator, i.e. to the active structure and the upper layers of the mirror AM.

The acoustic mirror AM preferably comprises layers having a sufficiently high electrical conductivity such that an electromagnetic shield is provided that protects the further electric circuit FEC from detrimental influences generated at the place of the active structure AS.

It is possible to electrically connect the acoustic mirror AM or at least one or a plurality of mirror layers of the mirror to a constant potential, e.g. a ground potential.

Figure 2:
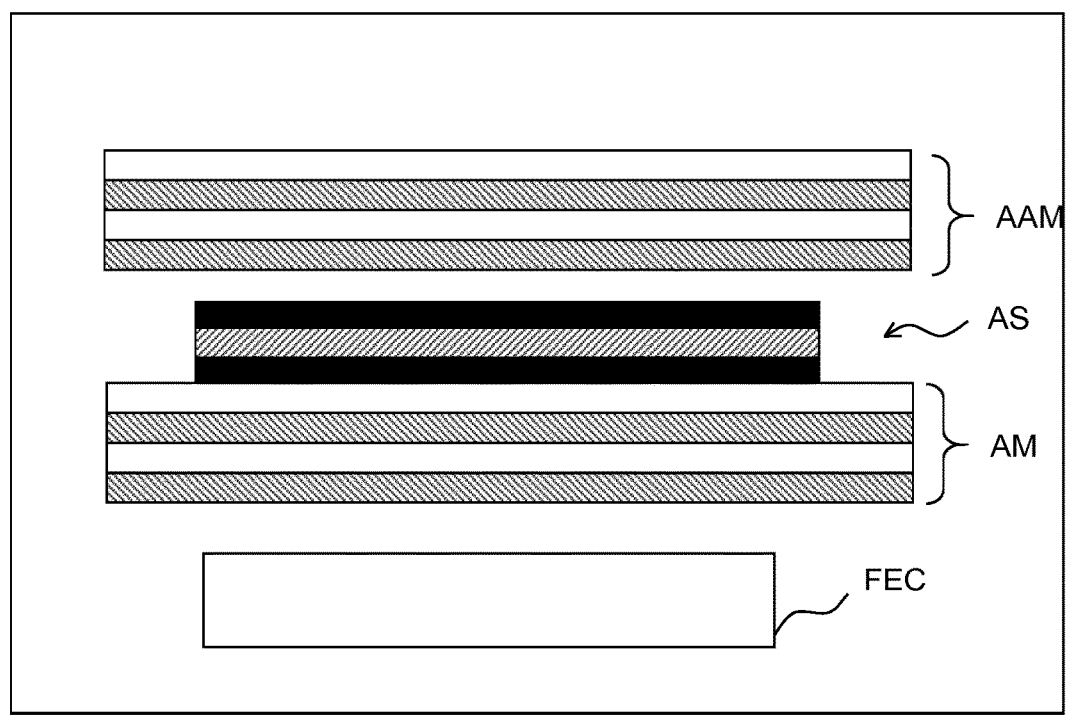
FIG. 2 illustrates the possibility of arranging the active structure between two acoustic mirrors to establish a double conductive Bragg mirror construction.

FIG. 2 illustrates the possibility of providing an additional acoustic mirror AAM arranged above the active structure AS such that the active structure AS is arranged between the acoustic mirror AM (arranged below the active structure AS) and the additional acoustic mirror AAM arranged above the active structure AS. Thus, the active structure AS is sandwiched between two acoustic mirrors. Both mirrors preferably comprise conducting layers such that the environment of the active structure AS, in particular the region below and the region above the active structure AS is shielded from detrimental influences emitted by the active structure AS.

Figure 3:
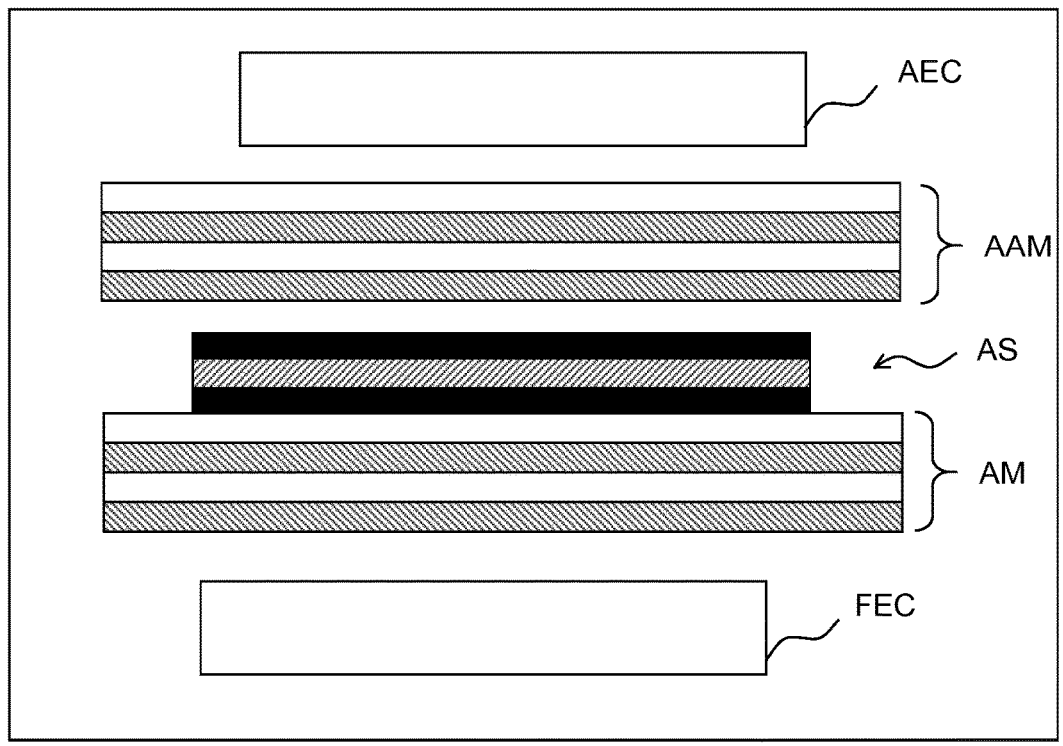
FIG. 3 illustrates the use of the decoupled volume above the additional acoustic mirror by arranging an additional electric circuit.

FIG. 3 illustrates the possibility of using the volume above the additional acoustic mirror AAM for arranging an additional electric circuit AEC that is also shielded from the active structure AS.

In principle, a layer structure with a plurality of acoustic mirrors stacked one above the other and circuit elements such as further electric circuits with sensitive circuit elements or active structures is possible. Thus, the principle of using acoustic mirrors to provide shielded regions can be extended to a plurality of two, three, four, five, six or more acoustic mirrors corresponding to three, five, six, seven and more regions shielded against detrimental influences.

Figure 4:
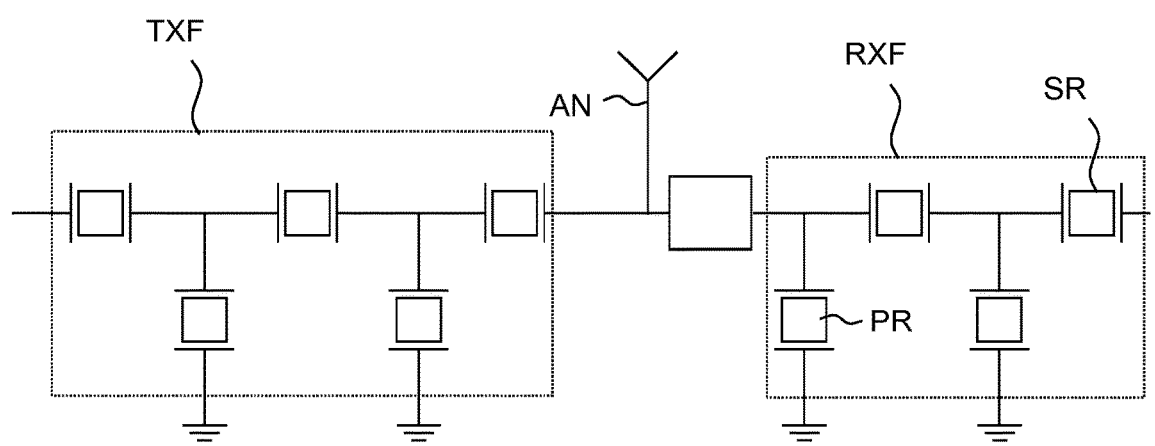
FIG. 4 illustrates a duplexer topology with filters have ladder-type like circuit topologies as a possible application of the RF filter device.

FIG. 4 illustrates a possible application of the RF filter device. The resonator structure and/or the further electric circuit and further resonator structures and additional electric circuits can be used to establish RF filters such as bandpass filters or band rejection filters. The filters can have a ladder-type like filter topology. Several filters can be combined to establish a multiplexer.

A ladder-type like filter topology has series resonators electrically connected in series in a signal path between a first port and a second port. Further, parallel resonators PR are arranged in shunt paths electrically connecting the signal path to a ground potential. One or more RF filters can be connected to, or coupled to, a common port, e.g. an antenna port. The antenna port can be connected to an antenna AN. Filters that are provided to guide transmission signals are transmission filters TXF. Transmission filters TXF block reception signals. Filters that are provided for guiding reception signals are reception filters RXF. Reception filters RXF block transmission signals. Between a transmission filter TXF and a reception filter RXF of a duplexer or of a multiplexer of a higher degree a matching circuit provided to establish an impedance matching between a common port and the filters can be arranged. For example elements of a matching circuit can be realized as elements of the further electric circuit or of an additional electric circuit in the RF filter device together with the resonator structures of series resonators or of parallel resonators of the corresponding filter.

The RF filter device is not limited to the technical details described above and by the shown embodiments. RF filter devices comprising further circuit elements, further active circuitry such as low noise amplifiers or power amplifiers are also possible. Thus, the RF filter device can also be a combined power amplifier and filter module.

LIST OF REFERENCE SIGNS

AAM: additional acoustic mirror
AEC: additional electric circuit
AM: acoustic mirror
AN: antenna
AS: active structure
BE: bottom electrode
FD: RF filter device
FEC: further electric circuit
M1: layer of first material of the acoustic mirror
M2: layer of a second material of the acoustic mirror
PM: piezoelectric material
PR: parallel resonator
RXF: reception filter
SR: series resonator
TE: top electrode
TXF: transmission filter

The invention claimed is:

1. An RF filter device, comprising;
   a resonator structure comprising a bulk acoustic wave (BAW) resonator, the resonator structure comprising an active structure and an acoustic mirror, wherein the active structure comprises a bottom electrode, a top electrode, and a piezoelectric material between the bottom electrode and the top electrode; and
   a further electric circuit comprising at least a capacitance element, wherein the acoustic mirror is arranged on one or more layers between layers including the active structure and layers including the further electric circuit, wherein the acoustic mirror is configured to establish an electromagnetic shield.

2. The RF filter device of claim 1, wherein the acoustic mirror is electrically conductive and connected to a ground potential.

3. The RF filter device of claim 1, wherein:
   the acoustic mirror comprises one or more layers having a first acoustic impedance and one or more layers having a second acoustic impedance larger than the first acoustic impedance; and
   the one or more layers of the first acoustic impedance and the one or more layers of the second acoustic impedance comprise metal.

4. The RF filter device of claim 3, wherein the one or more layers having the first acoustic impedance and the one or more layers having the second acoustic impedance have a conductivity equal to or greater than a conductivity of Aluminum.

5. The RF filter device of claim 3, wherein:
   the one or more layers having the first acoustic impedance comprise Al, Al-Alloys, Cu or Cu-alloys, SiO2, or SiOC; and
   layers other than the one or more layers having the first acoustic impedance and the one or more layers having the second acoustic impedance comprise W, Au, Pt, AlN, or Ta2O5.

6. The RF filter device of claim 1, wherein the further electric circuit additionally comprises at least one of:
   a LC circuit, a LCR circuit, an active circuit element, a switch, an RF switch, a logic circuit, a further electroacoustic resonator, or an RF filter.

7. The RF filter device of claim 1, further comprising an additional acoustic mirror, wherein the active structure is arranged between the acoustic mirror and the additional acoustic mirror.

8. The RF filter device of claim 7, further comprising an additional electric circuit, wherein the additional acoustic mirror is arranged between the active structure and the further electric circuit.

9. The RF filter device of claim 1, wherein the resonator structure and the further electric circuit are integrated monolithically.

10. The RF filter device of claim 1, wherein the resonator structure and the further electric circuit establish a band pass filter or a band rejection filter.

11. The RF filter device of claim 1, wherein the resonator structure and the further electric circuit are arranged on a carrier.

12. The RF filter device of claim 1, wherein the RF filter device is a software configurable RF filter.

13. A radio frequency (RF) filter device, comprising;
    a resonator structure comprising an active structure and an acoustic mirror, the active structure comprising a bottom electrode, a top electrode, and a piezoelectric material between the bottom electrode and the top electrode; and
    a further electric circuit, wherein the acoustic mirror is arranged between the active structure and the further electric circuit;
    wherein the RF filter device is a software configurable filter, wherein the further electric circuit comprises at least a switch.

14. The RF filter device of claim 1, wherein lateral dimensions on each side of the acoustic mirror exceed lateral dimensions of the further electric circuit.

15. The RF filter device of claim 3, wherein:
    the one or more layers having the first acoustic impedance comprise Aluminum; and
    the one or more layers having the second acoustic impedance comprise Tungsten (W).

* * * * *